United States Patent [19]

Eggert et al.

[11] 4,002,955
[45] Jan. 11, 1977

[54] HOUSING FOR ELECTRICAL, COMMUNICATIONS AND MEASURING DEVICES

[75] Inventors: Hans-Joachim Eggert, Karlsfeld; Georg Jungnitsch, Munich; Rudi Kuehne, Munich; Walter Waliczek, Munich; Heinrich Zenkert, Munich, all of Germany

[73] Assignee: Siemens Aktiengesellschaft, Berlin & Munich, Germany

[22] Filed: Mar. 24, 1975

[21] Appl. No.: 561,533

[30] Foreign Application Priority Data

Mar. 28, 1974 Germany .......................... 2415051

[52] U.S. Cl. .............................. 317/120; 312/319; 200/301; 292/53
[51] Int. Cl.² ........................................ H02B 1/04
[58] Field of Search ........................ 292/19, 49, 53; 312/319, 352, 348, 345, 332; 200/301, 322, 50 R, 50 AA; 317/100, 120, 101 CB, 101 DH

[56] References Cited

UNITED STATES PATENTS

| | | | |
|---|---|---|---|
| 2,230,599 | 2/1941 | O'Connor | 292/19 |
| 3,290,106 | 12/1966 | Wilson | 312/319 |
| 3,704,395 | 11/1972 | Hamer | 317/120 |
| 3,791,045 | 2/1974 | Landis | 292/53 |
| 3,833,280 | 9/1974 | Bell | 312/319 |
| 3,909,679 | 9/1975 | Petri | 317/100 |
| 3,925,710 | 12/1975 | Ebert | 317/100 |

Primary Examiner—Gerald P. Tolin
Attorney, Agent, or Firm—Hill, Gross, Simpson, Van Santen, Steadman, Chiara & Simpson

[57] ABSTRACT

A housing assembly which may be received in a vibration dampening frame is provided with an internal relatively slideable components carrier with one or more slide locks positioned between the components carrier and the housing in such a manner as to limit movement of the components carrier out of the housing to provide an intermediate stop point with the components carrier partially removed from the housing and held in place with respect to the housing. In the embodiment described the housing door which seals tight to the housing is pivotably mounted on the components carrier and slideable therewith.

9 Claims, 11 Drawing Figures

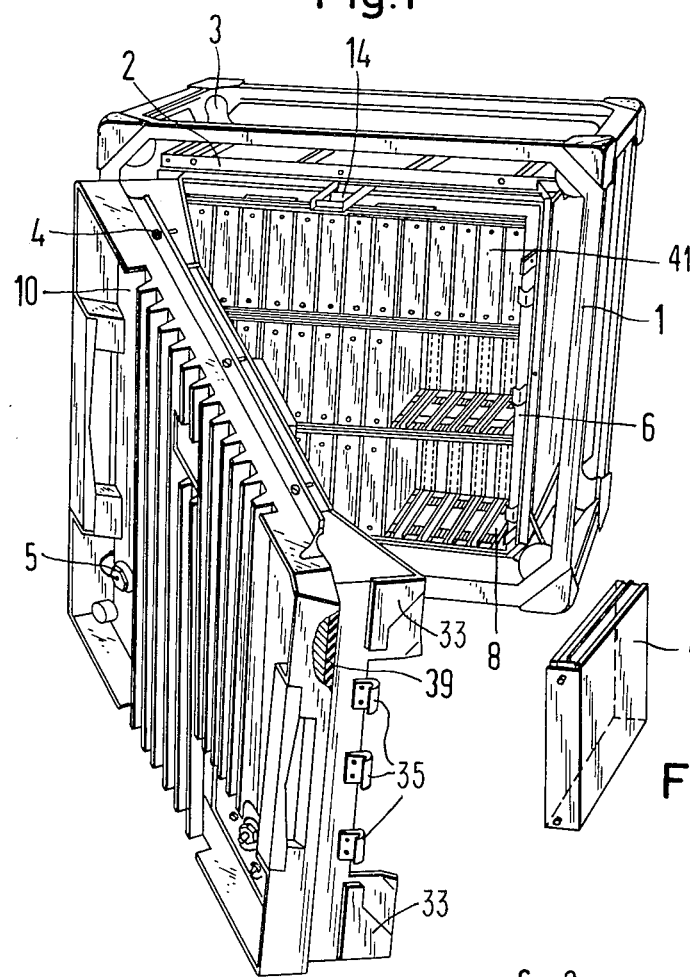
Fig.1
FIG. 11
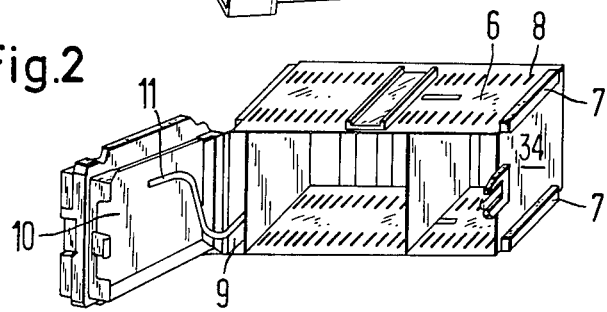
Fig.2

016
HOUSING FOR ELECTRICAL, COMMUNICATIONS AND MEASURING DEVICES

BACKGROUND OF THE INVENTION

1. Field of the Invention

This invention relates to housing members and more particularly to a housing member adapted for use in connection with electrical, communications and measuring devices.

2. Prior Art

Housing members such as those used in the electrical, communications and measuring fields which receive, internally of a sealable housing member, a plurality of component parts are known. It is also known to arrange such housings in a shock absorbing mounting such that one or more of such members can be mounted in a supporting frame which is capable of protecting them against vibration and shock. See for example German Offenlegungsschrift No. 1,665,772. The use of diagonal spring mounts protecting against movement in all directions are also known. It is likewise known to design the housings in a pressure and water tight manner wherein a removable front cover for the housing is sealed to the housing body through a front edge seal.

In such prior art constructions, often times the removable front of the housing is equipped with controls, dials, etc. which are also sealed water tight to the front, for example by means of O-rings.

In the use of such devices, it is often necessary to gain access to the interior of the housing in order to service the components contained therein. However, such prior art housings, and particularly when positioned in a vibration absorbing mount, are incapable of giving unobstructed access to the housing interior and particularly to the components carrier therein. This has often necessitated complete removal of the housing front. In those instances where the housing front is equipped with controls etc. which are operatively coupled to the components within the housing, the necessity to remove the front is objectionable.

Further, in servicing the components arranged in the housing, it is often desirable to be able to at least partially remove the components carrier. When doing so, however, it is important that the components carrier not be fully removed from the housing, particularly unintentionally.

It would therefore be an advance in the art to provide a housing of the type described which has means for allowing partial removal of the components carrier to a secure intermediate position wherein the carrier, although partially removed from the housing, is in fixed position preventing further accidental removal and where the housing is equipped with an openable front which is capable of being opened to a full extent allowing unobstructed access to the interior of the housing even when the housing is mounted in a protective frame.

SUMMARY OF THE INVENTION

Our invention overcomes the disadvantages of the prior art and provides a housing particularly adapted for use in the electrical, communications and measuring fields. The invention provides a rectangular housing having one open side which receives a components carrier therein. The open side is closed by a door which is carried by the components carrier. The components carrier is slideable in the open sided housing between a fully inserted position in which the door can be closed and a partially removed position in which, with the door open, full access is given to the interior. A slide lock is provided to secure the components carrier in the partially removed position to prevent accidental further removal.

As more fully described hereinafter, we have shown a housing of the above-described general type specifically adapted for use in the electrical communications field wherein the housing is mounted in a shock and vibration absorbing frame. The components carrier received interior of the housing is of the type in which structural components of the plug-in variety may be assembled. The components carrier is mounted in an extensible manner within the housing behind the removable door, or front cover, on which operating components, such as controls, dials and the like may be positioned which are operably connected to the components mounted in the components carrier.

The removable door, although carried by the components carrier is designed to be sealingly attached to the housing. The door is mounted to one side of the components carrier by means of a hinge and is closeable and latchable to the components carrier by a latch system which will be entirely interior of the housing when the components carrier is slid into its closed position within the housing. In that position, the front cover will be in sealed association with the remainder of the housing and can be affixed thereto by fastening means, such as screws.

When the components carrier is in its partially removed position, the door may be swung open on the hinge in a manner allowing it to clear the frame and to provide complete unobstructed access to the interior of the components carrier. By providing a hinge connection between the slideable components carrier and the door, it is assured that the door will be moved outwardly beyond the frame to a point in spaced relation to the open end of the housing where it can be swung freely into an open position without encumberance by the frame. Further by providing a latch between the components carrier and the door which is receivable entirely within the housing, it is provided that the door can be put into a closed position with respect to the components carrier and thereafter by sliding the components carrier fully into the housing providing, also, a front cover for the housing to sealingly close the housing.

In addition, by proper spacing of a slide locking system connection between the housing and the components carrier, it will be assured that the point of engagement of the slide lock when sliding the components carrier out of the housing will be at a point allowing unobstructed opening of the door.

In the embodiment illustrated, the slide locking system connection between the components carrier and the housing consists of two inter-fitting opposed u-shape cross section metal strips one of which is mounted to a housing wall interior thereof and the other of which is mounted on the components carrier with the legs of the u-shaped cross section of one strip being received between the legs of the u-shaped cross section of the other strip. Additionally, two springs are mounted interior of the innermost u-shaped strip, the springs disposed to urge locking blocks through alignable openings in the legs of each of the u-shaped strips. Thus when the strips have their openings aligned, the blocks will project through the legs of both strips thereby preventing further relative movement between the two strips.

In order to provide for release of the locking blocks, a release mechanism consisting of an independently slideable plate is affixed to the innermost u-shaped strip. The independently slideable plate carries two metal tongues at one end thereof which extend into the interior of the housing, the tongues forming a conical or wedge surfaced opening into which angled ends of the springs can extend. In this manner sliding the independently slideable plate will cause the wedge surfaces to engage the angled ends of the springs thereby urging the springs towards one another into the central cross section area of the innermost u-shaped cross section strip. This will withdraw the locking blocks from the aligned openings thereby allowing relative movement between the inter-fitting u-shaped cross section strips.

Additionally, we have provided an automatic reset for the slide locking system which will return the release mechanism to its non-releasing position upon movement of the components carrier into the housing. This is accomplished by providing a depending stop on the outermost u-shaped cross section strip which depends into the channel of the innermost u-shaped cross section strip and into an area which will engage a portion of the slideable plate during movement of the components carrier into its fully closed position. This will move the independently slideable plate to a point where the wedge surfaces are not engaging the springs thus releasing the locking blocks so that they will automatically again be urged through the openings in the legs of the u-shaped strips when the openings become aligned upon a further withdrawal of the components carrier from the housing.

In addition, we have provided for complete removal of the door when desired by utilizing a removable hinge pin connection between the door and the components carrier. In order to insure, however, that when the door is closed and latched to the components carrier that it will be at a predetermined level so as to provide a water tight seal with the housing, we have provided a latching assembly which includes guide surfaces on the components carrier which contact opposed guide surfaces on the door to properly align the door during closing.

It is therefore an object of this invention to provide an improved housing member.

It is another and more important object of this invention to provide a housing member for use in the electrical, communications and measuring fields wherein the housing includes a removable components carrier which is received in a housing with a slideable locking system between the housing and the carrier selectively limiting removal of the components carrier completely from the housing while allowing removal to a given point.

It is yet another and more important object of this invention to provide a housing member having one open side, a components carrier received within the housing member, a selectively engageable locking system between the components carrier and the housing effective to allow partial withdrawal of the components carrier from the housing to a predetermined point, and releasable to allow full withdrawal or return of the components carrier to the interior of the housing, the housing being closed by a door pivotably carried by the components carrier.

Other objects, features and advantages of the invention will be readily apparent from the following description of a preferred embodiment thereof, taken in conjunction with the accompanying drawings, although variations and modifications may be effected without departing from the spirit and scope of the novel concepts of the disclosure, and in which:

BRIEF DESCRIPTION OF THE DRAWINGS

FIG. 1 is a perspective view of the housing of this invention.

FIG. 2 is a simplified perspective view on a reduced scale of the components carrier of the housing of this invention with the door attached thereto.

FIG. 11, on page 1 of the drawings, is a perspective of a component receivable in the components carrier of the housing of this invention.

DESCRIPTION OF THE PREFERRED EMBODIMENTS

Figure 3:
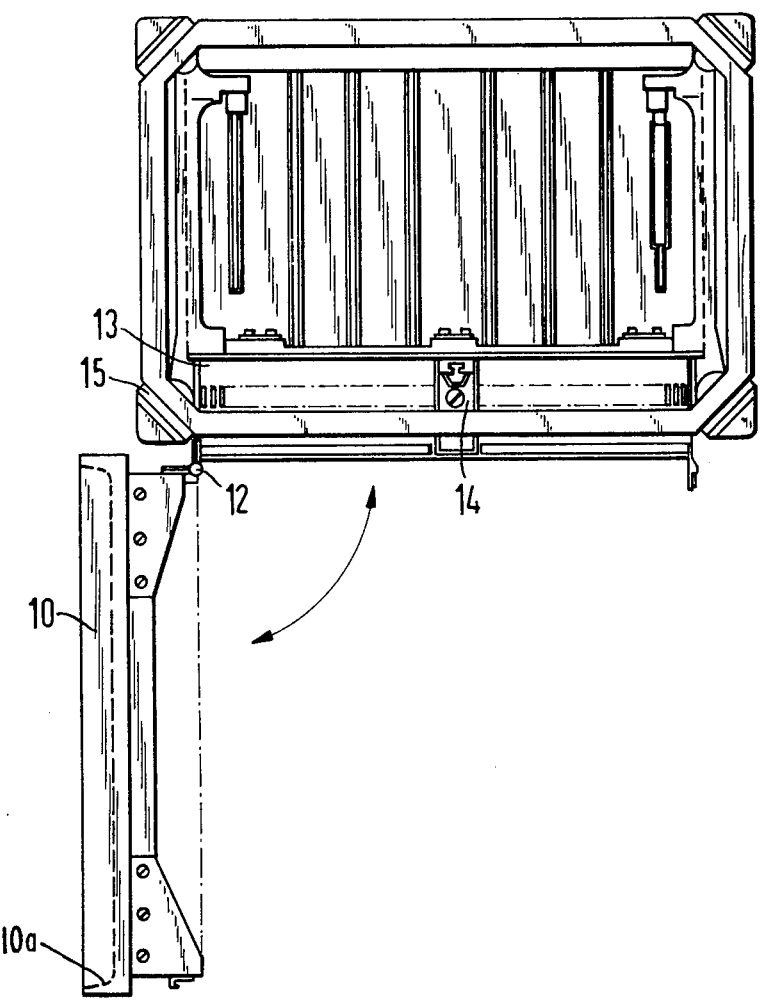
FIG. 3 is a top plan view of the housing of FIG. 1 with the components carrier partially withdrawn from the housing.

FIG. 1 illustrates a housing 2 of the type above-described which is positioned in an anti-vibration frame 1. The anti-vibration frame is constructed in a known manner and utilizes rubber buffers 3 arranged at the corners thereof in the diagonal direction of the housing for vibrational control.

The housing 2 consists of a completely sealed box having a front cover or door 10 which is attachable to the remainder of the housing 2 by means of screws 4. A rubber seal 39 assures tight sealing when so attached. The seal 39 may be arranged in a groove in the inner surface of the door and may be forced into engagement with a projection 36 (FIG. 4) which forms a sealing edge on a peripheral flange 37 of the housing 2 which flange, seal and groove extend around the entirety of the four sides of the open end of the housing 2 and the door 10 respectively.

The door 10 may be equipped with cooling ribs, operational components such as regulators, plugs, controls and dials and the like, one such being illustrated at 5 which provides for operation or electrical connection for the components interior of the housing. The components attached to the door are affixed thereto in a water tight manner.

The housing 2 has received therein a components carrier 6 which is slideable with respect to the housing, by means of slide bars 7. The components carrier 6 includes openings 8 therein for receipt of slide bars or the like of independent structural components of the plug-in type, one such being illustrated at 41. The wiring of the components is normally provided at the back side of the components carrier and may be directed to the door 10 via a clear lateral space 9 through a means such as a cable or cable harness 11. The cable or cable harness is flexible and is provided with a sufficient length to allow opening or removal of the door 10. As best illustrated in FIG. 3, the door 10 is attached to a side wall 13 of the components carrier by means of a hinge 12 which is preferably of the removable pin type. In this manner, the entire components carrier can be removed from the housing together with the cover in such a manner that it forms an entirely operable electrical unit even though removed from its housing.

Since, however, it is desirable, particularly with heavy devices, to test or perform other functions on the device when it is still positioned in the housing and in the anti-vibration frame, a slide locking system 14 is provided which will lock the components carrier in an intermediate position within the housing. In this manner, the components carrier and the door can be withdrawn partially from the housing to a point where the door can open completely on the hinge 12 without interference with the antivibration frame, and particularly the corner post 15 thereof. At that intermediate point, the slide locking system 14 will prevent further unintentional removal of the components carrier from the housing while still allowing for intentional removal when desired.

It is important to be able to fully open the door 10 to allow unobstructed access to the interior of the components carrier. Since the front door is generally constructed quite thick, not only in order to provide for the previously mentioned operating elements on the door but also to provide an outwardly extending protective flange edge 10a which will protect the operating elements from damages. Thus, since the door is thick, it is desired to provide a method by which it can be fully swung open. The provision of the slide locking system 14 assures that the intermediate position will be at a point at which the door can be fully swung open thereby giving unobstructed access to the subcomponents 16 received within the components carrier.

In addition, by providing a positive lock feature between the housing and the partially removed components carrier, it is assured that an accidental further withdrawal of the components carrier will not occur. Since it is normally quite difficult to pull the individual components out of the components carrier and equally difficult to install them in the carrier, absent the positive locking feature of the slide locking system described herein, unintentional movement of the components carrier with respect to the housing could easily occur.

FIGS. 4-8 illustrate the detail of the slide locking system 14, only one such locking system being shown in connection with the components carrier 6 and housing 2, however it should be understood that more than one system can be provided if desired.

The slide locking system consists of two u-shaped cross section metal strips 16 and 17 with the strip 16 having a slightly larger cross sectional area than the strip 17 whereby the strip 17 can be received between the legs of the strip 16. The strip 16 is mounted to the underside of the upper wall 18 of the housing 2 in an inverted position with the legs projecting downwardly into the housing. The strip 17 is mounted on the exterior of the top wall of the components carrier 6 with the legs projecting upwardly towards the housing wall 18.

The strip 17 is received interior of the strip 16 and is slideable with respect thereto.

Strip springs 19 and 20 are mounted to the side walls or legs of the u-shaped metal strip 17 adjacent a rear end thereof. The springs extend towards the front of the strip 17 and are spring biased towards the legs of the strip. Adjacent the front end of each of the spring strips, they are bent inwardly and converge towards one another terminating in spaced relationship. Just before the bend in the springs, locking blocks 21 are affixed to the outermost sides of the springs 19 and 20. The blocks are adapted to project through openings in the legs of the strip 17 under urging of the springs. The strip 16 has openings 21a provided therethrough which are alignable with the openings 21b in the strip 17 by movement of the strip 17 relative to the strip 16. Upon alignment of the openings 21a, 21b the springs 19 and 20 will urge the locking blocks 21 through the aligned openings thereby locking the two strips 16 and 17 against further relative movement. The positioning of the openings is predetermined such that the locking blocks 21 will engage both openings when the components carrier 6 has been partially removed from the housing 2 to a desired intermediate position where the door 10 can be completely and freely opened around the corner post 15 as illustrated in FIG. 3.

Figure 7:
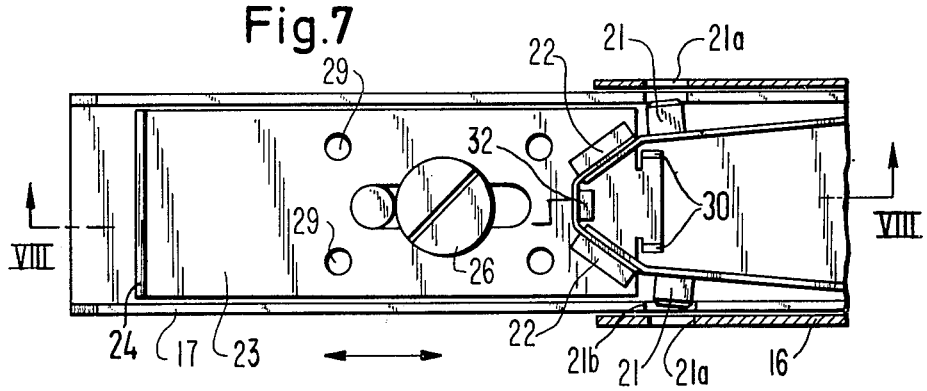
Figure 8:
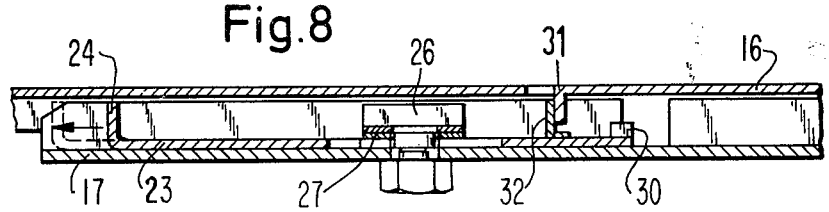

A release mechanism for releasing the locking blocks is also provided. The release system consists of a plate member 23 carried by the u-shaped metal piece 17 forward of the springs 19 and 20. The plate 23 has an upturned end 24 at the forward end of the strip 17. The plate 23 rides on the bight section of the strip 17 and has an elongated slot 25 through a central portion thereof which receives a screw 26 having a large head. The screw 26 can be affixed to the wall of the components carrier and washers 27 may be interposed between the large head and the plate 23. The screw 26 maintains the plate in position on the strip 17 while, due to the elongated opening 25, allows the plate 23 to be moved with respect to the strip 17. The plate carries an upwardly projecting spread leg member including tongues 22 which diverge from one another in the direction of the springs 19 and 20 forming a wide point opening greater than the distance between the in turned ends of the springs 19 and 20 as most clearly shown in FIg. 6. The innermost end of the plate 23 terminates in upturned tangs 30 which have their outermost side portions spaced from the tongues 22 thereby allowing the spring ends to be received between the tongues 22 and the tangs 30 as illustrated in FIG. 6. Movement of the plate 23 towards the springs will cause the springs to be drawn inwardly towards one another by contact with the tongues 22 as shown in FIG. 7. This will remove the locking blocks 21 from the openings 21a in the strip 16 thereby allowing relative movement between the strips 16 and 17. Thus, as illustrated in FIGS. 7 and 8, the plate 23 can be urged towards the springs to withdraw the locking blocks allowing such relative movement. Dimples 29 on the underside of the plate 23 are alignable with openings 28 in the bight of the strip 17 to provide a firm positioning of the plate 23 in a lock opening or a lock closing position. When in the lock closing position illustrated in FIGS. 5 and 6, the tanges 30 aid in maintaining the locking blocks 21 in the aligned openings.

Thus it can be seen, that when it is desired to further move the components carrier with respect to the housing from the intermediate position, sliding the plate 23 forward in the direction of the springs and of the interior of the housing will remove the locking blocks from the aligned openings in the legs 21a, 21b of the strips 16 and 17 thereby allowing further relative movement thereof. In this manner the entire components carrier can be removed from the housing if desired or, the components carrier can be returned to the full interior position in the housing.

In order to provide for automatic return of the slide locking system to a point where the springs will once again urge the locking blocks through the openings, a central portion 32 of the raised tongue member is adapted to engage a stop 31 depending from the bight section of the strip 16. This engagement occurs only when the components carrier is urged fully into the housing. Due to the engagement, the plate 23 will be caused to slide back to the non-spring engaging position of FIGS. 5 and 6 in the direction shown by the arrow of FIg. 8. Thus the tongues 22 will no longer contact the springs 19 and 20 which will urge the locking blocks 21 outwardly. Thereafter, further withdrawal of the components carrier from the housing will once again align the openings 21b in the legs of the strip 17 with the openings 21a in the legs of the strip 16 and the springs will urge the locking blocks into the aligned openings.

Figure 5:
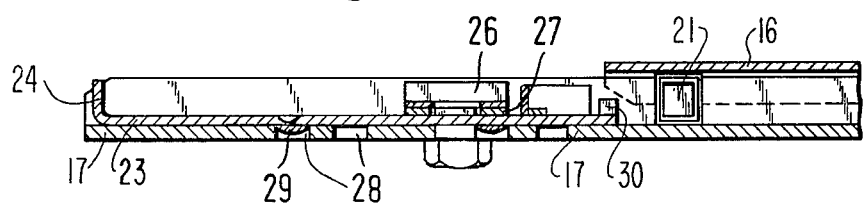
FIGS. 5 and 8 are fragmentary cross sectional views of the slide locking system shown in FIG. 4.
Figure 6:
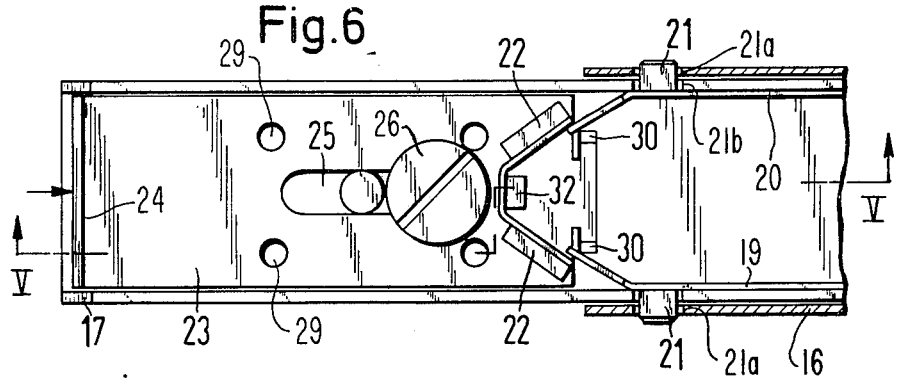
FIGS. 6 and 7 are top plan views of the slide locking system of FIG. 4 with portions thereof in section showing underlying portions.

It can be seen from a review of FIGS. 5 and 6 that when the locking blocks are urged through the aligned openings, a positive lock is provided which will prevent any further relative movement between the components carrier and the housing. The presence of the tangs 30 insures that the locking blocks can not accidentally be withdrawn from the aligned openings. In this manner, even relatively strong pulling or pushing forces encountered in the insertion or removal of the components from the components carrier will not cause the components carrier to move relative to the housing. However, in spite of this positive locking feature, the release mechanism of the plate 23 and the tongues 22 insure that further relative movement of the housing and components carrier is easily obtained when desired.

Figure 9:
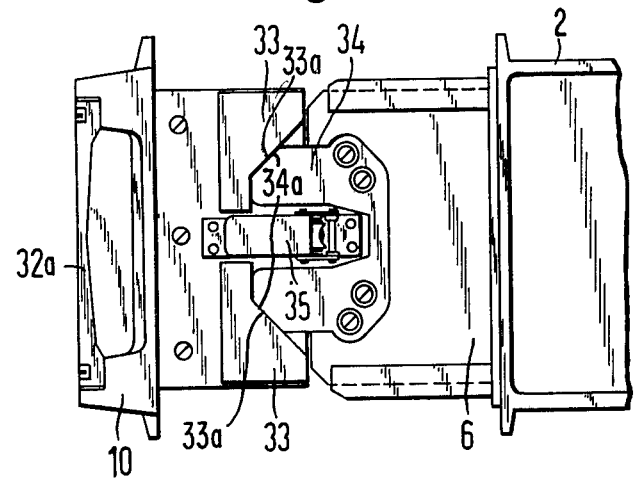
FIG. 9 is a plan view of a latch connection between the door and the components carrier of the housing of this invention.
Figure 10:
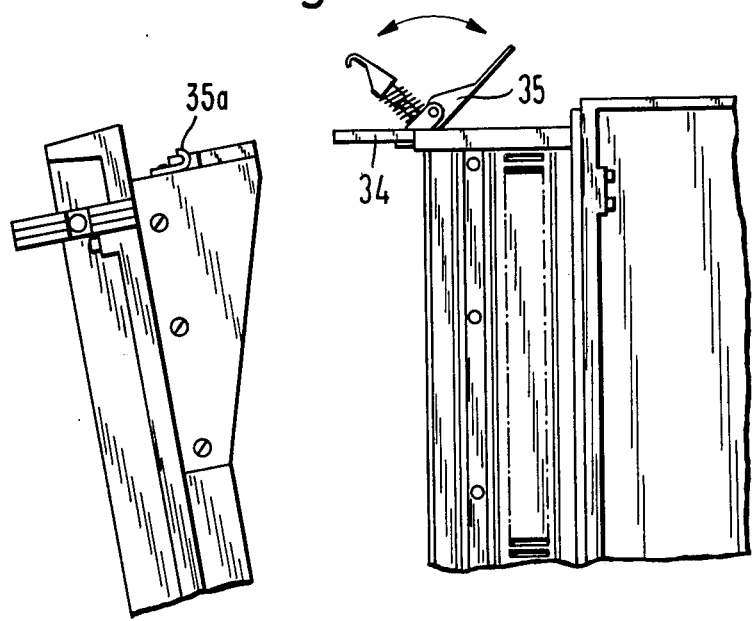
FIG. 10 is a fragmentary top plan view of the latch connection of FIG. 9 with the door illustrated as partially open.

FIGS. 9 and 10 illustrate a latching arrangement for holding the door 10 in positive closed connection with the components carrier 6. Over center claw latches 35 are attached to the side wall of the components carrier opposite the side wall 13 and opposed to the hinge 12. These engage claw tabs 35a on the door 10. In order to provide a positive alignment of the door to the components cabinet 6 and therefore to the housing 2 in order to insure that the seal 38 will sealingly abut the projection 36, blocks 33 are affixed to the door side. The blocks have cam surfaces 33a thereon. The cam surfaces 33a abut against cam surfaces 34a on a projecting member 34 affixed to the side wall of the components carrier 6. In the embodiment illustrated in Fig. 9, the member 34 has two projecting portions terminating in cam surfaces 34a disposed on either side of the latch 35. The door also has two cam block members 33 adjacent the latch portion 35a. It can thus be seen that during closure of the latch 35, the cam surfaces of the members 33 and 34 will be engaged to cause a positive vertical alignment of the door with respect to the components carrier 6.

As illustrated in FIG. 1, the cam surfaces can be spaced further apart (as shown by the positions of the blade 33) and more than one latch 35 can be utilized between the cam surfaces. If desired, of course more than two sets of opposed cam surfaces can be provided.

In the embodiment illustrated, the handles 32 of the door 10 are disposed on either side of the door and are recessed behind the extending protective flange. In addition, the handles may be made removable if desired. By providing handles on both sides it is relatively easy to withdraw the components carrier to the intermediate position where the slide locking system will actuate.

Figure 4:
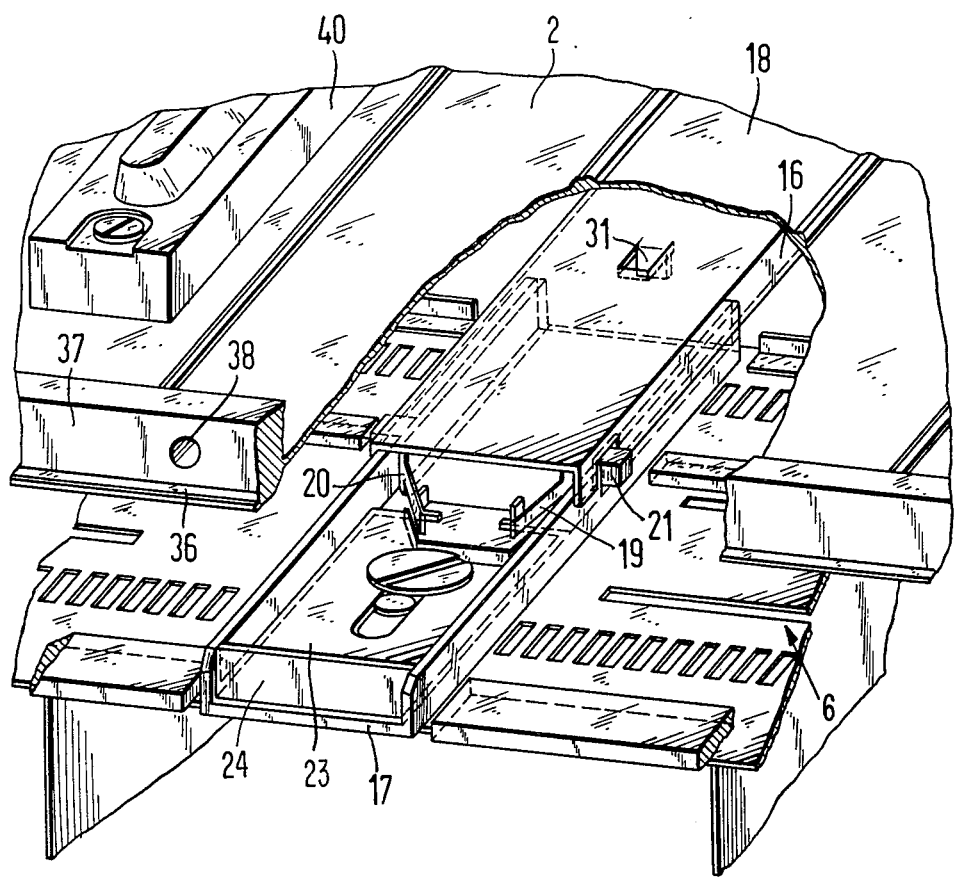
FIG. 4 is an enlarged fragmentary partially sectional view of the slide locking system between the components carrier and the housing of FIG. 1.

The housing 2 is provided with peripheral blocks 40 illustrated in FIG. 4 which include elastic material projections which serve to protect the entire device from hard shocks such as might be incurred during an accidental droppng or fall of the housing. In addition they allow alignment of a plurality of housings one atop the other where desired. The blocks 40 are preferably arranged at both the top and the bottom of the housing 2 and provide a stable support for the housing without the need of additional connections.

It can therefore be seen from the above that our invention provides a housing device particularly adapted for use in the electrical, communications and measuring fields wherein the housing includes a removable inner components carrier with the closure door of the housing being pivotably affixed to the components carrier which is received interior of the housing. A slide locking mechanism is provided connecting the components carrier and the housing which will allow removal of the components carrier to an intermediate position where it projects out of the open front of the housing by a predetermined amount sufficient to allow the door to be swung into the fully opened position giving unlimited access to the interior of the components carrier. At the intermediate position the slide locking system will automatically engage and prevent further relative movement between the housing and the components carrier. A release system is provided to intentionally release the slide locking mechanism thereby allowing further relative movement of the housing and components carrier when desired. An automatic reset is also provided which will automatically disengage the release mechanism upon full insertion of the components carrier into the housing thereby resetting it for automatic locking upon a further withdrawal of the components carrier from the housing. In addition, the components carrier and door are provided with an automatic alignment latching system which insures, that during latching of the door in a closed position with respect to the components carrier that the door will be properly aligned therewith so as to sealingly engage the housing periphery when the components carrier is fully inserted within the housing.

Although the teachings of our invention have herein been discussed with reference to specific theories and embodiments, it is to be understood that these are by way of illustration only and that others may wish to utilize our invention in different designs or applications.

We claim as our invention:

1. A housing assembly comprising: an outer housing member having one open side, a door member sealingly closing said open side and pivotally attached to a side wall of a components carrier slideably received within the housing which is removable therefrom through said open side, the door member moveable with said components carrier with respect to said housing from a housing open side closing position when the components carrier is fully received within the housing through a door opening position when the components carrier is at an intermediate position partially removed from the housing, the door being fully openable at the intermediate position providing unobstructed access to the interior of the components carrier, a slide locking system having a portion carried by the housing interior thereof and a portion carried by the components carrier and moveable therewith, the slide locking system including means engaging both portions at said intermediate position for preventing relative movement between the components carrier and the housing locking the components carrier with respect to the housing in the intermediate position, the slide locking system being disengageable to move the components carrier to one of a fully closed position with the components carrier fully received within the housing and a fully withdrawn position with the components carrier removed from the housing, the slide locking system being disengaged in the closed and withdrawn positions.

2. A housing assembly according to claim 1 wherein the slide locking system includes two inter-fitting u-shaped cross section strips, attached respectively to an inside surface of a wall of the housing and to an outside surface of the components carrier, the legs of the u-shaped cross section of one strip received between the legs of the u-shaped cross section of the other strip, the one strip having associated therewith spring means urging locking members through alignable openings in the legs of the strips whereby when said openings are aligned said springs will urge said locking members through the aligned openings, the locking members engageable with side walls of the openings to prevent relative movement of the strips.

3. A housing assembly according to claim 2 wherein a release means is provided and is carried by said one strip and is selectively engageable to withdraw the locking members from the aligned openings.

4. The housing assembly of claim 3 wherein the release mechanism includes an independently slideable member received between the legs of the one u-shaped cross section strip, the independently slideable member having means thereon for engaging portions of the springs to urge the said springs towards one another into the central area of the one u-shaped cross section strip whereby the locking members will be withdrawn from the openings, the engagement of the independently slideable member portions with the springs being in dependent response to movement of the independently slideable portion with respect to the one u-shaped cross section strip.

5. A housing assembly accordng to claim 4 characterized in that means are provided to return the independently slideable member to a position not in engagement with the springs from a position in engagement with the springs automatically upon movement of the components carrier to a position where it is fully received within the housing.

6. A housing assembly according to claim 1 wherein the housing member is received in an anti-vibration frame having corner posts aligned with corner edges of the housing member, the intermediate position being selected such that at the intermediate position the door can be fully pivoted open without obstruction by a corner post standing in parallel direction with a hinge connection between the door and the components carrier and projecting in a plane beyond the plane of the door remote from the housing when the components carrier is fully received within the housing.

7. A housing assembly according to claim 6 wherein the pivotable connection between the door and the components carrier is by way of a pin removable hinge.

8. A housing assembly according to claim 7 wherein a latch assembly is provided between the components carrier and the door on a side of the components carrier opposite the hinge connection, the latch assembly including opposed cam surfaces carried by said door and said components carrier engageable with one another upon closure of the door and effective to properly align said door with said components carrier upon engagement of the latching assembly to latch the door to the components carrier.

9. The housing assembly of claim 1 wherein an inside face of the door has a sealing strip extending around the door adjacent the outer periphery thereof, the outer periphery overlying the outer periphery of the open side of the housing, the outer periphery of the open side of the housing having a projecting seal rib which extends into sealing contact with the sealing strip when the door is closed and the components carrier is fully received in the housing.

* * * * *